(12) United States Patent
Wang

(10) Patent No.: US 10,644,688 B2
(45) Date of Patent: May 5, 2020

(54) BIASING CIRCUIT FOR SWITCH

(71) Applicant: Power Integrations, Inc., San Jose, CA (US)

(72) Inventor: Zhao-Jun Wang, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 48 days.

(21) Appl. No.: 15/977,860

(22) Filed: May 11, 2018

(65) Prior Publication Data

US 2018/0351542 A1 Dec. 6, 2018

Related U.S. Application Data

(60) Provisional application No. 62/514,496, filed on Jun. 2, 2017.

(51) Int. Cl.
*H03K 17/06* (2006.01)
*H03K 17/94* (2006.01)
*H03K 17/687* (2006.01)
*H03K 17/567* (2006.01)
*H02M 1/08* (2006.01)
*H02M 3/335* (2006.01)

(52) U.S. Cl.
CPC ............ *H03K 17/063* (2013.01); *H02M 1/08* (2013.01); *H02M 3/33507* (2013.01); *H02M 3/33561* (2013.01); *H03K 17/567* (2013.01); *H03K 17/687* (2013.01); *H03K 17/94* (2013.01); *H03K 2217/0063* (2013.01); *H03K 2217/0081* (2013.01)

(58) Field of Classification Search
None
See application file for complete search history.

(56) References Cited

U.S. PATENT DOCUMENTS

| 6,650,060 | B2 | 11/2003 | Okuda |
| 7,102,202 | B2 | 9/2006 | Kobayashi et al. |
| 7,109,952 | B2 | 9/2006 | Kwon |
| 7,405,595 | B2 | 7/2008 | Yang et al. |
| 9,831,768 | B2 * | 11/2017 | Lam ..................... H02M 3/156 |
| 2005/0083270 | A1 | 4/2005 | Miyazawa |

(Continued)

OTHER PUBLICATIONS

Stevens, John , "Using a Single-Output Gate Driver for High-Side or Low-Side Drive", Mar. 2013.

*Primary Examiner* — Lincoln D Donovan
*Assistant Examiner* — Khareem E Almo
(74) *Attorney, Agent, or Firm* — Andrew J. Borja

(57) ABSTRACT

A driver circuit for use in a controller includes a signal generator coupled to generate a first control signal and a second control signal in response to a drive signal that is coupled to control switching of a secondary switch that is to be coupled to the driver circuit and referenced to a reference voltage that is greater than a ground reference voltage. A second switch is coupled to be controlled by the second control signal such that the reference voltage is substantially applied to a control of the secondary switch when the drive signal controls the secondary switch to be off. A first switch is coupled to be controlled by the first control signal such that the sum of the reference voltage and a first voltage is substantially applied to the control of the secondary switch when the drive signal controls the secondary switch on.

27 Claims, 3 Drawing Sheets

(56) References Cited

U.S. PATENT DOCUMENTS

| | | |
|---|---|---|
| 2008/0158110 A1 | 7/2008 | Iida et al. |
| 2012/0106256 A1 | 5/2012 | Meier et al. |
| 2013/0241601 A1 | 9/2013 | Chen et al. |
| 2014/0346874 A1* | 11/2014 | Fang ................ H02M 3/33523 307/31 |

* cited by examiner

BIASING CIRCUIT FOR SWITCH

CROSS-REFERENCE TO RELATED APPLICATIONS

This application claims the benefit of U.S. Provisional Application No. 62/514,496 filed on Jun. 2, 2017, the contents of which are incorporated herein by reference.

BACKGROUND INFORMATION

Field of the Disclosure

The present invention relates generally to power converters, and more specifically to power converters with secondary switches.

Background

Electronic devices (such as cell phones, tablets, laptops, etc.) use power to operate. Switched mode power converters are commonly used due to their high efficiency, small size, and low weight to power many of today's electronics. Conventional wall sockets provide a high voltage alternating current. In a switching power converter, a high voltage alternating current (ac) input is converted to provide a well-regulated direct current (dc) output through an energy transfer element to a load. In operation, a switch is turned ON and OFF to provide the desired output by varying the duty cycle (typically the ratio of the on time of the switch to the total switching period), varying the switching frequency, or varying the number of on/off pulses per unit time of the switch in a switched mode power converter.

The energy transfer element may have one or more primary windings coupled to the input side of the power converter and one or more secondary windings coupled to the output side of the power converter. Power converters may also include switches as synchronous rectifiers coupled to the secondary side of the power converter.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
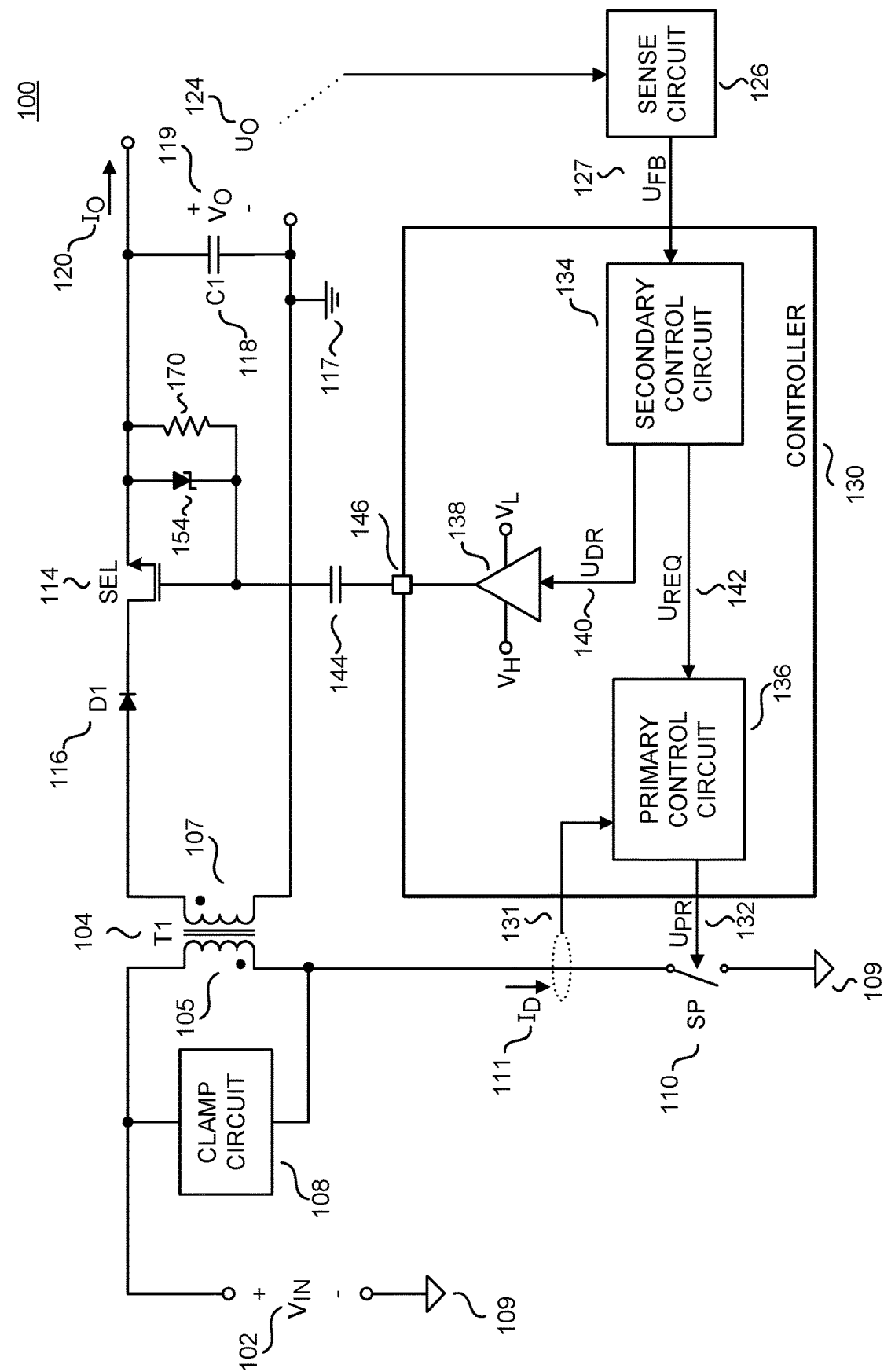
FIG. 1 illustrates one example of a power converter and controller, in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present disclosure.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

For each output of a multi-output power converter there may an associated output switch, which may be referred to as a selection switch, a selection field effect transistor (selFET) or a secondary switch, which controls the transfer of the appropriate amount of power to the particular output of the power converter. In addition, power converters may employ a high-side secondary switch which is referenced to the output of the power converter. Metal-oxide-semiconductor field effect transistors (MOSFETs) may be used for these output switches or high-side secondary switches. The MOSFETs are coupled to a secondary winding and the applicable output of the power converter, with the drain of the MOSFET coupled to the secondary winding and the source coupled to the output. To turn on an n-type MOSFET (NMOS), the voltage drop between the gate and the source should be greater than the threshold voltage of the MOSFET. Depending on the application, an output of the power converter may be 10V or greater and as such, a MOSFET may be referenced to a voltage that is 10V or greater. For the example of a MOSFET whose source is coupled to a 10V output, the gate should be driven with a voltage that is greater than 10V (the voltage at the source) plus the threshold voltage to turn on the MOSFET. The resultant gate voltage (the sum of the output voltage and the threshold voltage) to drive the MOSFET on may be difficult to provide. In particular, the resultant sum of the output voltage and the threshold voltage may be difficult to provide from a single terminal of the controller of the power converter. MOSFETs are also generally rated by how much gate-source voltage ($V_{GS}$) the MOSFET can handle. In general the greater the gate-source voltage ($V_{GS}$) which the MOSFET can handle, the more expensive the MOSFET. MOSFETS can be either n-type (NMOS) or p-type (PMOS) devices. In general, NMOS devices have lower $R_{DSON}$ for the same size as a PMOS device.

In accordance with teachings of the present disclosure, a switch that is referenced to the output of a power converter may utilize a passive switch along with a biasing capacitor to charge the gate/control terminal of the switch to the same voltage as its source/reference terminal (i.e., the output of the power converter). When utilizing the passive switch and the biasing capacitor, the controller may use a single terminal to drive the switch in accordance with the teachings of the present.

Embodiments in accordance with the teachings of the present disclosure may include a driver circuit with a biasing capacitor and a diode (as a passive switch) to drive a switch, which is referenced to a non-zero voltage (such as the output of the power converter). The biasing capacitor is coupled to the control terminal (e.g., the gate) of the switch. The driver circuit is coupled to the other end of the biasing capacitor and provides logic high and low voltages to drive the gate of the switch in response to the drive signal to turn on/off the switch. When the drive signal indicates that the switch should be turned off, the driver circuit provides a logic low voltage and the diode conducts and charges the biasing capacitor such that the gate/control terminal is substantially equal to the source/reference terminal of the switch. As such, prior to the switch being turned on, the gate/control terminal of the switch is charged to substantially the same voltage as its source/reference terminal. In one example, the gate/control terminal of the switch is charged to the source/reference terminal minus a diode voltage drop. When the drive signal indicates that the switch should turn on, the driver circuit provides a logic high voltage to drive the gate of the switch. Since the gate/control terminal of the switch is substantially equal to the source/reference terminal of the switch due to the biasing capacitor, the additional logic high voltage provided by the driver circuit turns on the switch. This is due to the gate/control terminal of the switch being greater than the sum of the threshold voltage of the switch and the voltage on the source/reference terminal. Without the biasing capacitor, other driver circuits would provide the sum of the driving voltage and non-zero reference voltage to turn on the switch. In addition, when a MOSFET is used for the switch, applying a voltage on the biasing capacitor such that the gate/control terminal is substantially equal to the voltage on the source/reference of the MOSFET allows for the use of a lower rated gate-source voltage MOSFET (e.g., cheaper MOSFET) as may otherwise have been required without the biasing. For example of a MOSFET which is referenced to, and does not include biasing, that MOSFET would typically be rated to have a gate-source voltage to withstand 10V.

To illustrate, FIG. 1 shows a function block diagram of a power converter 100 including a controller 130 with a driver circuit 138 and a Zener diode 154 in accordance with the teachings of the present disclosure. The example of the power converter 100 includes an energy transfer element T1 104, a primary winding 105 of the energy transfer element 104, secondary winding 107 of the energy transfer element 104, a clamp circuit 108, a power switch SP 110, an input return 109, diode 116, a switch 114, output capacitors C1 118, sense circuit 126, a biasing capacitor 144, a Zener diode 154, and a resistor 170. The biasing circuit for the switch SEL 114 includes the biasing capacitor 144 and Zener diode 154. The biasing circuit may also optionally include resistor 170. Further, the controller 130 is shown as including a secondary control circuit 134, primary control circuit 136, a driver circuit 138, and terminal 146. Also shown in FIG. 1 are an input voltage $V_{IN}$ 102, output voltage $V_O$ 119, output current $I_O$ 120, output quantity $U_O$ 124, feedback signal $U_{FB}$ 127, a switch current $I_D$ 111, a current sense signal 131, a primary drive signal $U_{PR}$ 132, a drive signal $U_{DR}$ 140, and a request signal $U_{REQ}$ 142. In the illustrated example, the power converter 100 is shown as having a flyback topology. It is appreciated that other known topologies and configurations of power converters may also benefit from the teachings of the present disclosure.

The example power converter 100 can provide output power to a load from an unregulated input voltage $V_{IN}$ 102, which may be a rectified and filtered ac line voltage or a dc input voltage. The input voltage $V_{IN}$ 102 is coupled to the energy transfer element 104. In some embodiments, the energy transfer element 104 may be a coupled inductor, a transformer, or an inductor. The example energy transfer element 104 shown in FIG. 1 includes two windings, a primary winding 105 and secondary winding 107. However, in other examples, the energy transfer element 104 may have more windings. Coupled across the primary winding 105 is the clamp circuit 108, which limits the maximum voltage across the power switch SP 110. The primary winding 105 is further coupled to the power switch 110, and the power switch 110 is further coupled to input return 109.

The secondary winding 107 is coupled to diode 116. The diode 116 is further coupled to switch SEL 114, which is shown as an n-type MOSFET (NMOS). However, it should be appreciated that a p-type MOSFET (PMOS) may be used as well. Switch SEL 114 may also be referred to as a secondary switch. Switch SEL 114 includes a first terminal coupled to secondary winding 107 via diode 116 and a second terminal coupled to output capacitor C1 118. Output capacitor C1 118 is shown as being coupled to the secondary winding 107 and output return 117 at one end, and is coupled to the second terminal of switch SEL 114 at the other end. The voltage across output capacitor C1 118 is the output voltage $V_O$ 119. As shown, the switch SEL 114 is referenced to the high side of output capacitor C1 118, e.g., the output voltage $V_O$ 119. In other words, the second terminal of switch SEL 114, which is the source terminal of switch SEL 114 in FIG. 1, is not coupled to a ground reference voltage (e.g., zero volts). Instead, the source terminal of switch SEL 114 is coupled to, or referenced to, an output voltage that under normal operating conditions is greater than a ground reference voltage such as zero volts. As a consequence, in order to turn on the switch SEL 114, the gate/control terminal of the switch SEL 114 should be driven with a voltage greater than the sum of the output voltage $V_O$ 119 and the threshold voltage of the switch SEL 114. As will be further discussed, the biasing capacitor 144 is coupled to the gate/control terminal of the selection switch SEL 114 to bias the gate voltage of the switch SEL 114 to substantially the output voltage $V_O$ 119.

The power converter 100 further includes circuitry to regulate the output, which is exemplified as the output quantity $U_O$ 124. In general, the output quantity $U_O$ 124 is the output voltage $V_O$ 119, the output current $I_O$ 120, or a combination of the two. The sense circuit 126 is coupled to sense the output quantity $U_O$ 124 and to provide the feedback signal $U_{FB}$ 127 which is representative of the output quantity $U_O$ 124.

As shown, the controller 130 is coupled to receive the feedback signal $U_{FB}$ 127. The controller 130 is also coupled to receive the current sense signal 131, representative of the drain current $I_D$ 111 of the power switch SP 110, and may be a voltage or current signal. In addition, the controller 130 provides the primary drive signal $U_{PR}$ 132 to control various switching parameters of the power switch SP 110 to control the transfer of power between the input and the output of the power converter 100. Examples of such parameters may include switching frequency (or period), duty cycle, ON and OFF times of the power switch SP 110, or varying the number of pulses per unit time of the power switch SP 110.

Controller 130 includes the secondary control circuit 134, primary control circuit 136, and the driver circuit 138. The controller 130 may be implemented as a monolithic integrated circuit or may be implemented with discrete electrical components or a combination of discrete and integrated components. Controller 130 and power switch SP 110 could form part of an integrated circuit that is manufactured as either a hybrid or monolithic integrated circuit. Further, the controller 130 may be implemented as one or more integrated circuits that is manufactured as either a hybrid or monolithic integrated circuit. In addition, the controller 130 may be implemented as one or more packages, which include the one or more integrated circuits. For example, the secondary control circuit 134 and the driver 138 may be in one integrated circuit while the primary control circuit 136 may be included in another integrated circuit. The integrated circuits may communicate to each other via a communication link.

As shown, the secondary control circuit 134 receives the feedback signal $U_{FB}$ 127 and outputs the request signal $U_{REQ}$ 142, which may be a voltage or current signal. In operation, the secondary control circuit 134 determines if power should be transferred from the input to the output of the power converter 100 in response to the feedback signal $U_{FB}$ 127. The request signal $U_{REQ}$ 142 may be representative of a request to deliver power from the input of power converter 100. In other words, the request signal $U_{REQ}$ 142 is representative of a request to turn on the primary power switch SP 110. The primary control circuit 136 receives the request signal $U_{REQ}$ 142 (along with the current sense signal 131), and outputs the primary drive signal $U_{PR}$ 132. In one example, the primary control circuit 136 is galvanically isolated from the secondary control circuit 134 and the request signal $U_{REQ}$ 142 is communicated via a communication link. Further, the primary control circuit 136 may be in a separate integrated circuit from the secondary control circuit 134 and the driver circuit 138.

The secondary control circuit 134 also outputs the drive signal $U_{DR}$ 140, which is a voltage or current signal that controls the switching of the switch SEL 114 in response to the feedback signal $U_{FB}$ 127. The driver circuit 138 receives the drive signal $U_{DR}$ 140, and provides the drive voltages (e.g., a logic high voltage $V_H$ and a logic low voltage $V_L$) which turn on and turn off the switch SEL 114 via terminal 146. When the drive signal $U_{DR}$ 140 indicates that the switch SEL 114 should turn on, the driver circuit 138 provides the voltage $V_H$ to the terminal 146. When the drive signal $U_{DR}$ 140 indicates that the switch SEL 114 should turn off, the driver circuit 138 provides the voltage $V_L$ to the terminal 146. In one example, voltage $V_H$ is substantially equal to the supply voltage of the driver circuit 138, and $V_L$ may be equal to the voltage of return 117. Thus, in one example, voltage $V_H$ is substantially equal to a logic high voltage, and $V_L$ may be substantially equal to a logic low voltage. In one example, the drive signal $U_{DR}$ 140 is a rectangular waveform with varying lengths of logic high and logic low sections. Logic high sections may correspond to turning on the switch SEL 114, while logic low sections may correspond to turning off the switch SEL 114. An "on" switch (i.e., closed) may conduct current, while an "off" switch (i.e., open) cannot conduct current.

The biasing circuit is shown as including the biasing capacitor 144 and Zener diode 154. The resistor 170 may also be optionally included. Biasing capacitor 144 is shown as coupled to the gate/control terminal of switch SEL 114 and the output of the driver circuit 138 (terminal 146). Coupled across the gate/control terminal and source/reference terminal of the switch SEL 114 are Zener diode 154 and resistor 170. The anode of Zener diode 154 is coupled to the source/reference of switch SEL 114 while the cathode of Zener diode 154 is coupled to the gate/control terminal of switch SEL 114. The resistor 170 is shown as coupled in parallel to the Zener diode 154. Or in other words, one end of resistor 170 is coupled to the source/reference of switch SEL 114 while the other end is coupled to the gate/control terminal of switch SEL 114. While FIG. 1 illustrates a Zener diode, other diodes may also be utilized. As such, the controller 130 may control the turn on and turn off of the switch SEL 114 from a single terminal 146. Further, the terminal 146 may be a low-voltage terminal. For example, the terminal 146 may conduct voltages less than 15 V.

In operation, Zener diode 154 conducts and charges the biasing capacitor 144 when the switch SEL 114 is off (i.e., drive signal $U_{DR}$ 140 is logic low and the driver circuit 138 drives terminal 146 low with voltage $V_L$). The biasing capacitor 144 is charged to substantially the output voltage $V_O$ 119 minus the forward voltage drop of Zener diode 154 minus the voltage $V_L$, or mathematically: $V_O-V_D-V_L$. As such, the voltage at the gate/control terminal of switch SEL 114 is substantially the output voltage $V_O$ 119 minus the forward voltage drop of Zener diode 154, or mathematically: $V_O-V_O$. When the drive signal $U_{DR}$ 140 indicates that switch SEL 114 should turn on (i.e., logic high), the driver circuit 138 drives terminal 146 high to voltage $V_H$. The biasing capacitor 144 is charged to substantially the output voltage $V_O$ 119 minus the Zener diode 154 forward voltage drop and minus voltage $V_L$ and the voltage on the gate/control terminal of the switch SEL 114 is substantially equal to the sum of the voltage across biasing capacitor 144 and the voltage $V_H$, and the switch SEL 114 is turned on, and Zener diode 154 does not conduct. As such, the controller 130 may control the switching of the switch SEL 114 from a single terminal 146.

The Zener diode 154 may also be utilized to discharge the biasing capacitor 144 such that the gate/control terminal of switch SEL 114 is substantially the same as the output voltage $V_O$ 119 regardless of fluctuations in the output voltage. For example, the gate/control terminal of switch SEL 114 is charged to the output voltage $V_O$ 119. If the output voltage $V_O$ 119 drops, the voltage at the gate/control terminal of switch SEL 114 should also decrease, otherwise you may inadvertently turn on the switch SEL 114. As such, the Zener diode 154 may discharge the biasing capacitor 144 when the voltage difference is greater than the breakdown voltage of Zener diode 154 to decrease the gate/control terminal voltage of the switch SEL 114. Further the Zener diode 154 may also be used for gate-source protection of the switch SEL 114. In one example, the breakdown voltage of the Zener diode 154 is greater than voltage $V_H$ of the driver circuit 138 minus voltage $V_L$ such that the Zener diode 154 doesn't inadvertently turn on to save energy. The resistor 170 may also be utilized to discharge the biasing capacitor 144. When the switch SEL 114 is turned off for enough time (i.e., the terminal 146 is driven low for a long enough amount of time), noise may charge the biasing capacitor 144 such that the gate/control terminal of switch SEL 114 is greater than the output voltage $V_O$ 119 and inadvertently turn switch SEL 114 on. The resistor 170 may then discharge the biasing capacitor 144 to return the voltage at the gate/control terminal of switch SEL 114 to substantially the output voltage $V_O$ 119. As such the resistor 170 may prevent the switch SEL 114 from inadvertently turning on.

Figure 2:
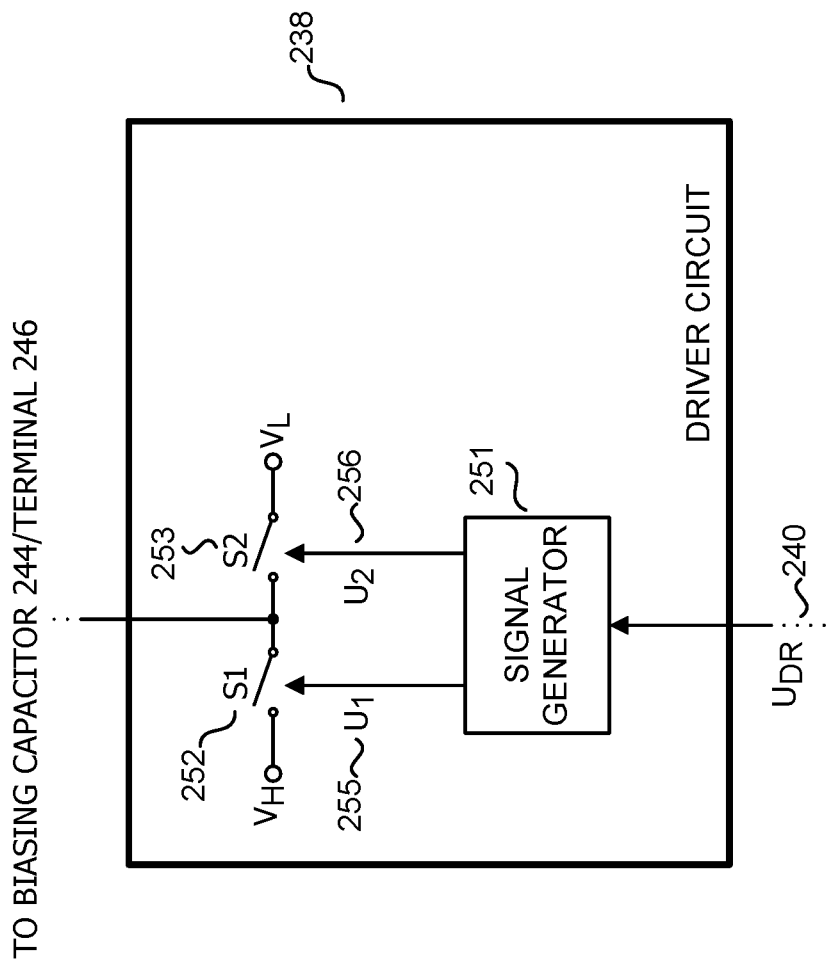
FIG. 2 illustrates an example driver circuit of FIG. 1, in accordance with an embodiment of the present disclosure.

FIG. 2 illustrates one example of the driver circuit 238 including signal generator 251 and switches S1 252 and S2

253. Switches S1 252 and S2 253 may be implemented as MOSFETs. Further shown are voltage $V_H$ (e.g., logic high drive voltage) and $V_L$ (e.g., logic low drive voltage), and control signals $U_1$ 255 and $U_2$ 256. It should be appreciated that similarly named and numbered elements are coupled and function as described above.

The driver 238 receives the drive signal $U_{DR}$ 240 at the signal generator 251. The signal generator 251 outputs control signals $U_1$ 255 and $U_2$ 256, which control switches S1 252 and S2 253, respectively, in response to the drive signal $U_{DR}$ 240. When the drive signal $U_{DR}$ 240 indicates that the switch SEL 244 should turn on, the signal generator 251 outputs the signal $U_1$ 255 and $U_2$ 256 such that the voltage $V_H$ is provided to terminal 246 (i.e., outputted by the driver circuit 238). When the drive signal $U_{DR}$ 240 indicates that the switch SEL 244 should turn off, the signal generator 251 outputs the signals $U_1$ 255 and $U_2$ 256 such that the voltage $V_L$ is provided to terminal 246 (i.e. outputted by the driver circuit 238). In one example, voltage $V_H$ is substantially equal to the supply voltage of the driver circuit 238, and $V_L$ may be equal to the voltage of the return of the power converter output. Control signals $U_1$ 255 and $U_2$ 256 are rectangular waveforms with varying lengths of logic high and logic low sections. In one example, a logic high value may correspond to an on (e.g., closed) switch, while a logic low value may correspond to an off (e.g., open) switch.

In various examples, a leading edge of the drive signal $U_{DR}$ 240 is coupled to cause the control signal $U_1$ 255 to rise to a logic high value after the control signal $U_2$ 256 falls to a logic low value. Thus, in one example, the corresponding trailing and leading edges of control signal $U_2$ 256 and control signal $U_1$ 255 occur at different times such that the respective trailing and leading edges of the second and first control signals $U_2$ 256 and $U_1$ 255 do not overlap. Similarly, in the various examples, a trailing edge of the drive signal $U_{DR}$ 240 is coupled to cause the control signal $U_1$ 255 to fall to a logic low value prior to control signal $U_2$ 256 rising to a logic high value. In one example, the corresponding trailing and leading edges of control signal $U_1$ 255 and control signal $U_2$ 256 occur at different times such that respective trailing and leading edges of the first and second control signals $U_1$ 255 and $U_2$ 256 do not overlap. In one example, the signal generator 251 may include a non-overlapping clock generator to generate signals $U_1$ 255 and $U_2$ 256 such that their respective leading and trailing edges do not overlap. However, examples of the present disclosure may also include second and first control signals $U_2$ 256 and $U_1$ 255 which may overlap. In another example, the signal generator 251 may include an inverter and control signal $U_2$ 256 is the inverted drive signal $U_{DR}$ 240 while the control signal $U_1$ 255 is substantially the same as the drive signal $U_{DR}$ 240.

As shown, one end of switch S1 252 is coupled to voltage $V_H$ (drive voltage), while the other end is coupled to the biasing capacitor 244 via terminal 246. One end of switch S2 253 is also coupled to the biasing capacitor 244 via terminal 246, while the other end is coupled to voltage $V_L$. When the switch S1 252 is turned on and switch S2 253 is turned off, the voltage provided at the output of the driver circuit 238 is substantially voltage $V_H$ (drive voltage). Conversely, when switch S2 253 is on and switch S1 252 is off, the voltage at the output of the driver circuit 238 is substantially voltage $V_L$. In one example, the voltage $V_H$ (drive voltage) is greater than the threshold voltage of the switch SEL 214, and the voltage $V_L$ is substantially equal to the ground reference voltage at output return 217. For example, the voltage $V_H$ (drive voltage) is substantially 5V, while the voltage $V_L$ is substantially 0V.

Figure 3:
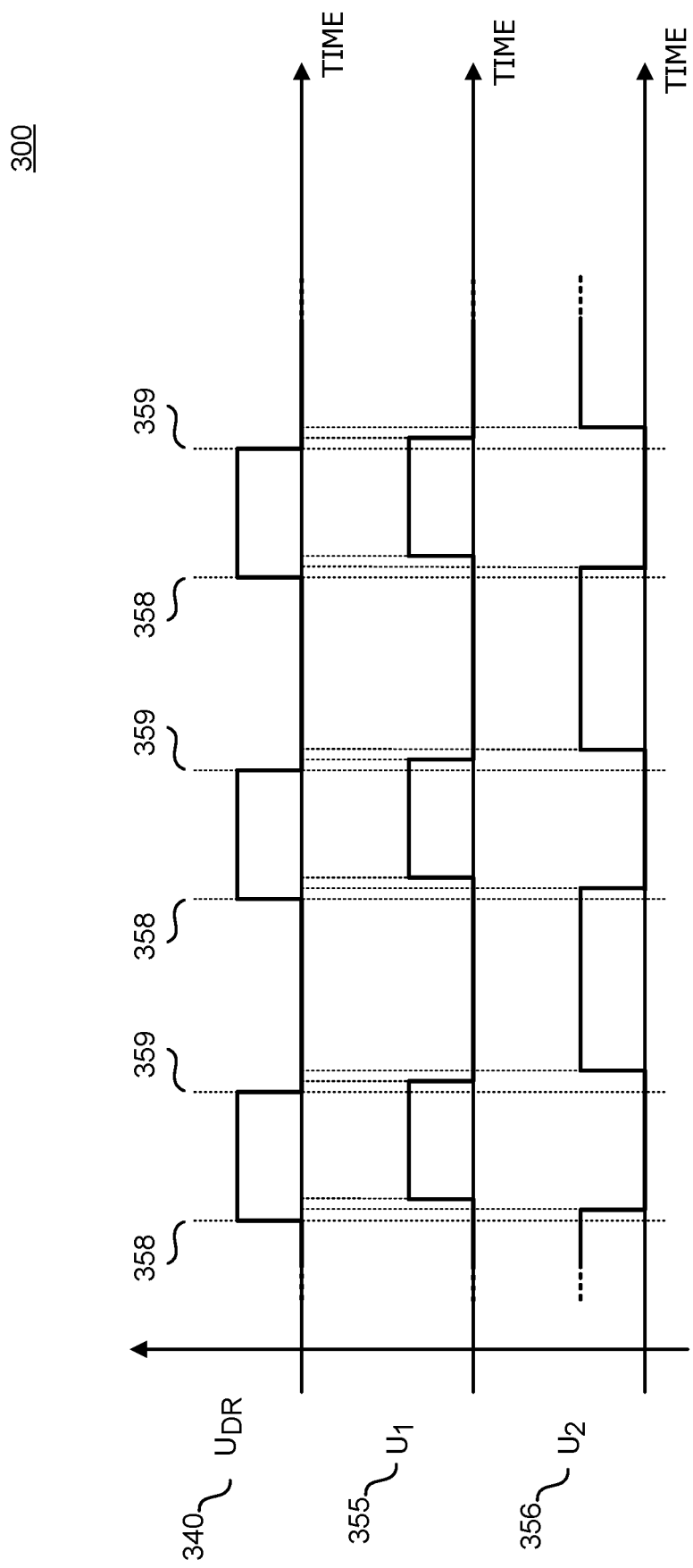
FIG. 3 illustrates an example timing diagram of various signals of the controller of FIG. 2, in accordance with an embodiment of the present disclosure.

FIG. 3 illustrates a timing diagram 300 of example drive signal $U_{DR}$ 340, and control signals $U_1$ 355 and $U_2$ 356. For every leading edge 358 of the drive signal $U_{DR}$ 340, signal $U_2$ 356 falls to a logic low value prior to the signal $U_1$ 355 rising to a logic high value. As shown in FIG. 3, there is a delay after the leading edges 358 of drive signal $U_{DR}$ 340 for the trailing edge of signal $U_2$ 356. There is another delay after the trailing edge of signals $U_2$ 356 for the leading edge of signal $U_1$ 355. As such, switches S1 and S2 discussed above are not on at the same time. In one example, each delay may be about 5 nanoseconds (ns).

For every trailing edge 359 of the drive signal $U_{DR}$ 340, signal $U_1$ 355 falls to a logic low value prior to signal $U_2$ 356 rising to a logic high value. In the figure shown, there is a delay after the trailing edges 359 for the trailing edge of signal $U_1$ 355. There is another delay after the trailing edge of signal $U_1$ 355 for the leading edge of signal $U_2$ 356. Similar to the leading edge 358, the delays may be about 5 ns.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A driver circuit configured for use in a controller, the driver circuit comprising:
   a signal generator configured to generate a first control signal and a second control signal in response to a drive signal that controls switching of a secondary switch that is coupled to the driver circuit, wherein the secondary switch is referenced to a reference voltage that is greater than a ground reference voltage;
   a second switch configured to be controlled by the second control signal, wherein the second switch is configured such that the reference voltage is applied to a control terminal of the secondary switch when the drive signal controls the secondary switch to be off; and
   a first switch configured to be controlled by the first control signal, wherein the first switch is configured such that a sum of the reference voltage and a first voltage is applied to the control of the secondary switch when the drive signal controls the secondary switch on.

2. The driver circuit of claim 1, wherein the second switch is turned on and the first switch is turned off when the drive signal controls the secondary switch to be off, wherein the second switch is coupled to a first logic state drive voltage.

3. The driver circuit of claim 1, wherein the first switch is turned on and the second switch is turned off when the drive signal controls the secondary switch to be on, wherein the first switch is coupled to a second logic state drive voltage.

4. The driver circuit of claim 1, wherein a leading edge of the drive signal is configured to cause the second control signal to fall to a first logic value prior to the first control signal rising to a second logic value such that respective trailing and leading edges of the second and first control signals do not overlap.

5. The driver circuit of claim 1, wherein a trailing edge of the drive signal is configured to cause the first control signal to fall to a first logic value prior to the second control signal rising to a second logic value such that respective trailing and leading edges of the first and second control signals do not overlap.

6. The driver circuit of claim 1, wherein the first switch and the second switch are controlled such that a biasing capacitor coupled to the control terminal of the secondary switch is charged such that the sum of the reference voltage and the first voltage is applied to the control terminal of the secondary switch.

7. The driver circuit of claim 6, wherein a diode is coupled between the control terminal and the reference voltage, wherein the diode is configured to conduct and charge the biasing capacitor to the sum of the reference voltage and the first voltage is applied to the control terminal of the secondary switch when the secondary switch is turned off, and wherein the diode is configured not to conduct when the secondary switch is turned on.

8. The driver circuit of claim 7, wherein a resistor is coupled across the diode.

9. The driver circuit of claim 1, the driver circuit configured to control the secondary switch from a single terminal.

10. A power converter, comprising:
an energy transfer element having a primary winding coupled to an input of the power converter and a secondary winding coupled to an output of the power converter;
a power switch coupled to the primary winding, the power switch configured to be switched to control a transfer of energy from the input of the power converter to the output of the power converter in response to a feedback signal representative of the output of the power converter;
a secondary switch coupled to the secondary winding and referenced to an output voltage of the power converter;
a biasing capacitor coupled to a control of the secondary switch, the biasing capacitor coupled to store charge from the output voltage of the power converter;
a diode coupled to the control of the secondary switch and a reference of the secondary switch, the diode coupled to charge the biasing capacitor; and
a controller including a driver circuit, the controller comprising:
a signal generator configured to generate a first control signal and a second control signal in response to a drive signal that is configured to control switching of the secondary switch, the secondary switch configured to be coupled to the driver circuit, wherein the secondary switch is referenced to the output voltage of the power converter;
a second switch configured to be controlled by the second control signal, wherein the second switch is configured such that the output voltage is applied to a control terminal of the secondary switch when the drive signal controls the secondary switch to be off; and
a first switch configured to be controlled by the first control signal, wherein the first switch is configured such that a sum of the output voltage and a first voltage is applied to a control of the secondary switch when the drive signal controls the secondary switch on.

11. The power converter of claim 10, the power converter further comprising a resistor coupled across the diode, the resistor coupled to discharge the biasing capacitor.

12. The power converter of claim 10, wherein the diode is a Zener diode.

13. The power converter of claim 12, wherein a breakdown voltage of the Zener diode is greater than the first voltage.

14. The power converter of claim 12, wherein the Zener diode is coupled to provide protection for the control of the secondary switch.

15. The power converter of claim 12, wherein the Zener diode is coupled to discharge the biasing capacitor to facilitate keeping the secondary switch off.

16. The power converter of claim 10, the controller further comprising a secondary control circuit configured to generate the drive signal in response to feedback signal.

17. The power converter of claim 16, further comprising a primary control circuit coupled to the secondary control circuit, the primary control circuit configured to control the switching of the power switch.

18. The power converter of claim 17, the primary control circuit coupled to the secondary control circuit through a communication link.

19. The power converter of claim 10, the driver circuit configured to control the secondary switch from a single terminal.

20. The power converter of claim 10, wherein the secondary switch is a selection switch.

21. The power converter of claim 10, the second switch coupled to a voltage that is equal to a return of the output of the power converter.

22. The power converter of claim 21, wherein the first voltage is substantially equal to a supply voltage of the driver circuit.

23. The power converter of claim 10, the signal generator comprising a non-overlapping clock generator, the non-overlapping clock generator configured to generate the first control signal and second control signal.

24. The power converter of claim 10, wherein the signal generator comprises an inverter, wherein the second control signal is an inverted drive signal and the first control signal is the drive signal.

25. The power converter of claim 16, the controller further comprising a primary control circuit that is galvanically isolated from the secondary control circuit.

26. The power converter of claim 25, the secondary control circuit configured to communicate a request signal via a communication link to the primary control circuit to control switching of the power switch.

27. The power converter of claim 26, wherein the primary control circuit receives the request signal and outputs a primary drive signal to the power switch.

* * * * *